United States Patent
Eymery et al.

(10) Patent No.: US 10,040,095 B2
(45) Date of Patent: Aug. 7, 2018

(54) METHOD FOR ORIENTING ELONGATED OBJECTS ARRANGED ON A SURFACE OF A SUBSTRATE

(71) Applicant: COMMISSARIAT A L'ENERGIE ATOMIQUE ET AUX ENERGIES ALTERNATIVES, Paris (FR)

(72) Inventors: Joël Eymery, Sassenage (FR); Amine El Kacimi, Grenoble (FR); Olivier Dellea, La Taludiere (FR); Emmanuelle Pauliac-Vaujour, Moirans (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/267,990

(22) Filed: Sep. 16, 2016

(65) Prior Publication Data
US 2017/0080457 A1    Mar. 23, 2017

(30) Foreign Application Priority Data
Sep. 17, 2015  (FR) ...................................... 15 58717

(51) Int. Cl.
| | |
|---|---|
| B32B 37/00 | (2006.01) |
| C03C 25/68 | (2006.01) |
| C03C 15/00 | (2006.01) |
| C23F 1/00 | (2006.01) |
| B44C 1/22 | (2006.01) |
| H01L 21/00 | (2006.01) |
| H01L 21/302 | (2006.01) |

(Continued)

(52) U.S. Cl.
CPC ............... *B05D 3/12* (2013.01); *B05D 1/005* (2013.01); *B05D 1/60* (2013.01); *B05D 3/0254* (2013.01); *B05D 3/06* (2013.01); *B05D 3/107* (2013.01); *B82B 3/0066* (2013.01); *B82Y 40/00* (2013.01); *C01B 32/00* (2017.08); *C01B 32/05* (2017.08); *C01B 32/15* (2017.08); *C01B 32/158* (2017.08); *H01L 21/02118* (2013.01); *H01L 21/02376* (2013.01); *H01L 21/02115* (2013.01)

(58) Field of Classification Search
None
See application file for complete search history.

(56) References Cited

U.S. PATENT DOCUMENTS

| | | | |
|---|---|---|---|
| 2009/0237886 A1* | 9/2009 | Iwai | ...................... H01L 23/373 361/708 |
| 2010/0203316 A1 | 8/2010 | Hata et al. | |
| 2011/0260116 A1* | 10/2011 | Plee | ...................... B82Y 30/00 252/511 |

OTHER PUBLICATIONS

Search Report as issued in French Patent Application No. 1558717, dated Apr. 8, 2016.

(Continued)

*Primary Examiner* — Stephanie P Duclair
(74) *Attorney, Agent, or Firm* — Pillsbury Winthrop Shaw Pittman LLP

(57) ABSTRACT

A method for orienting elongated objects arranged on the surface of a substrate, the elongated objects extending according to an initial orientation, the method including depositing on the surface of the substrate at least one layer of a soft material covering at least partially a portion of the elongated objects, and applying a mechanical stress on at least one portion of the layer of soft material in such a way as to modify the orientation of at least one portion of the elongated objects.

14 Claims, 3 Drawing Sheets

(51) Int. Cl.
    *H01L 21/461*    (2006.01)
    *B05D 3/12*    (2006.01)
    *B82Y 40/00*    (2011.01)
    *C01B 32/15*    (2017.01)
    *C01B 32/158*    (2017.01)
    *C01B 32/00*    (2017.01)
    *C01B 32/05*    (2017.01)
    *H01L 21/02*    (2006.01)
    *B05D 1/00*    (2006.01)
    *B05D 3/02*    (2006.01)
    *B05D 3/06*    (2006.01)
    *B05D 3/10*    (2006.01)
    *B82B 3/00*    (2006.01)

(56) References Cited

OTHER PUBLICATIONS

Koester, R., et al., "M-Plane Core-Shell InGaN/GaN Multiple-Quantum-Wells on GaN Wires for Electroluminescent Devices," Nano Letters, Oct. 2011, vol. 11, No. 11, pp. 4839-4845.

Tessarek, C., et al., "Optical properties of vertical, tilted and in-plane GaN nanowires on different crystallographic orientations of sapphire," Journal of Physics D: Applied Physics, Sep. 2014, vol. 47, No. 39, pp. 1-9.

* cited by examiner

Fig. 2A      Fig. 2A'

METHOD FOR ORIENTING ELONGATED OBJECTS ARRANGED ON A SURFACE OF A SUBSTRATE

CROSS REFERENCES TO RELATED APPLICATIONS

This application claims priority to French Patent Application No. 1558717, filed Sep. 17, 2015, the entire content of which is incorporated herein by reference in its entirety.

FIELD

The technical field of the invention is that of materials science, and more particularly that of objects manufactured on a substrate.

The invention relates to a method for orienting elongated objects arranged on a surface of a substrate.

BACKGROUND

Various elongated objects, among which nano-objects such as nanowires or nanotubes, are currently used for many applications. Nanowires are used for example to manufacture piezoelectric devices, such as capacitive deformation sensors, or optical devices such as light-emitting diodes or photovoltaic devices.

There are two major methods for manufacturing nano-objects. The first method consists in growing the nano-objects in a solution, without a substrate. In this case, the nano-objects are dispersed in the solution. The second method consists in growing the nano-objects using a substrate, according to the same orientation with respect to the surface of the substrate.

Among the techniques of growing nano-objects, mention can in particular be made of molecular beam epitaxy (MBE), and vapour phase epitaxy using for example molecules of the metal organic type or hydrides as gas source, respectively called MOVPE for "Metal Organic Vapour Phase Epitaxy" and HVPE for "Hydride Vapour Phase Epitaxy".

The nano-objects can also be obtained by other methods such as liquid phase chemical growth or top-down approaches based on lithography and etching methods.

The nano-objects are anisotropic, i.e. they have one or several physical properties that vary according to the orientation considered. Therefore, it is necessary for certain applications to orient the nano-objects in a desired orientation. Indeed, when the physical characteristic considered is oriented, it is necessary to orient this characteristic of all of the nano-objects in the same orientation. Indeed, nano-objects that are arranged in the same orientation but head-to-toe, i.e. in opposite directions, can have their responses to an excitation be cancelled rather than added together. This is the case for example in the field of piezoelectricity.

A known method of orienting nanowires is the Langmuir-Blodgett method, shown in FIGS. 1A and 1B. However, this method can be applied only to nanowires 101 dispersed in a solution 102. Consequently, in order to orient nanowires 101 manufactured using a substrate, it is first of all necessary to disperse them in the solution 102. Then, after the adding of chemical ligands, the nanowires 101 in suspension in the solution 102 rise to the surface and form a layer of nanowires 101. The density of nanowires 101 on the surface of the solution 102 is controlled by the displacement of hydrophobic barriers 103 which exert a pressure on the layer of nanowires 101. The nanowires 101 are then transferred onto a support 104, with the latter being plunged in the solution 102 then removed from the solution 102. A first disadvantage of this method is that these technological steps are expensive and are time consuming.

Moreover, on the support 104, the nanowires 101 are globally parallel to one another but the direction of their crystallographic axis is not always the same. FIG. 1B is a top view of the surface of the solution 102 and shows the loss of orientation of the nanowires 101, with the crystallographic axes being represented by arrows 105.

With this method, the nanowires 101 also tend to overlap and to form bundles, which can hinder, according to the target application, the operation of the final device wherein the support 104 is arranged. As such, the Langmuir-Blodgett method makes it possible to assemble nanowires 101 only on small surfaces, up to 16 cm$^2$, because for larger surfaces, the inhomogeneity of the pressure exerted solely on the edges of the layer of nanowires 101 would be excessively high.

SUMMARY

An aspect of the invention aims to improve the control of the orientation of elongated objects arranged on the surface of a substrate by choosing an orientation and a direction in which to orient the elongated objects, which therefore prevents the overlapping of the elongated objects and the formation of bundles. In parallel to the improvement in the control of the orientation of elongated objects, this invention also aims to reduce the time and the means required for orienting elongated objects while still increasing the surface whereon the elongated objects are oriented.

In the preceding and following text, as well as in the claims, the term "elongated objects" designates objects that extend over a substrate according to a favoured orientation and that have a form factor greater than or equal to 10. The favoured orientation forms any angle with the substrate. The elongated objects have any section, for example elliptical or polygonal. The elongated objects are for example obtained by growth in gas or liquid phase, or by lithography and etching methods. In addition, in an embodiment, the elongated objects have at least one tensor physical property of which the main vectors are oriented in any way with respect to the favoured orientation of the elongated objects.

Another aspect of the invention relates to a method for orienting elongated objects arranged on a surface of a substrate, the elongated objects extending according to an initial orientation, the method comprising the following steps:
- depositing on the surface of the substrate at least one layer of a soft material covering at least partially a portion of the elongated objects;
- applying a mechanical stress on at least one portion of the layer of soft material in such a way as to modify the orientation of at least one portion of the elongated objects.

The soft material is a material wherein the interactions between the elements constituting it are very low, of about thermal excitation. This can in particular range from plastic materials to soap bubbles, and also gels, elastomers, liquid crystals, cosmetic creams, mud and ceramic pastes. This characteristic makes for the soft material easily encompassing the elongated objects without breaking them and without leaving cavities. In addition, the soft material has substantial susceptibility with respect to external stresses such as a mechanical deformation.

It is thanks to the fact that the soft material covers the elongated objects that the latter can be oriented by the application of a mechanical stress on the layer of soft material, the displacement of the latter subsequently resulting in the displacement of the elongated objects. It is possible to choose an orientation and a direction for the elongated objects by varying the mechanical stress applied.

In addition, the elongated objects are oriented directly on the growth substrate. It is then possible to avoid technological steps which are expensive and which consume time, such as the prior step of dispersion of the elongated objects in a solution. The time and the means or system required for the orientation of the elongated objects are therefore reduced. Directly working on the substrate also implies being able to orient the elongated objects over a larger surface, with the substrate having a surface that can reach several square meters.

The methods according to one or more embodiments of the invention may also comprise one or several characteristics among the following, taken individually or in any technically possible combination:

- the elongated objects have a length according to their initial orientation, with the layer of soft material having a thickness at least equal to the length of the elongated objects;
- the mechanical stress applied on said at least one portion of the layer of material is a shear stress and/or a torsional stress;
- the mechanical stress is applied by means of a bumper exerting a pressure on said at least one portion of the layer of soft material;
- the mechanical stress is applied on all of the layer of soft material by means of a plate;
- the method comprises a step of modifying the viscosity of the layer of soft material;
- the modification of the viscosity of the layer of soft material is carried out by means of an annealing, a chemical reaction or exposure to a chemical reaction or exposure to radiation;
- the method comprises a step of peeling during which the layer of soft material, with the elongated objects, is separated from the substrate;
- the method comprises a step of partially or entirely removing the layer of soft material;
- the method comprises a step of depositing at least one additional layer on the layer of soft material, before or after the application of the mechanical stress;
- the mechanical stress is applied on the additional layer;
- the method comprises a step of partially or entirely removing the additional layer;
- the step of removal is carried out by evaporation, by chemical dissolution or by etching;
- the soft material is cyclododecane or a polymer chosen from among the following: polydimethylsiloxane, polyethylene glycol, poly(methyl methacrylate);
- the soft material is a material that has an electrical or optical property.

The method according to an embodiment of the invention applies particularly in the case where the elongated objects have at least one dimension less than 10 μm, and even more particularly in the case where the elongated objects have at least one dimension less than 1 μm.

BRIEF DESCRIPTION OF THE FIGURES

The invention and its various applications shall be better understood when reading the following description and examining the figures that accompany it, among which;

FIGS. 2A to 2D schematically show steps for orienting elongated objects arranged on the surface of a substrate, according to a first embodiment of the method according to the invention;

Figure 1A:
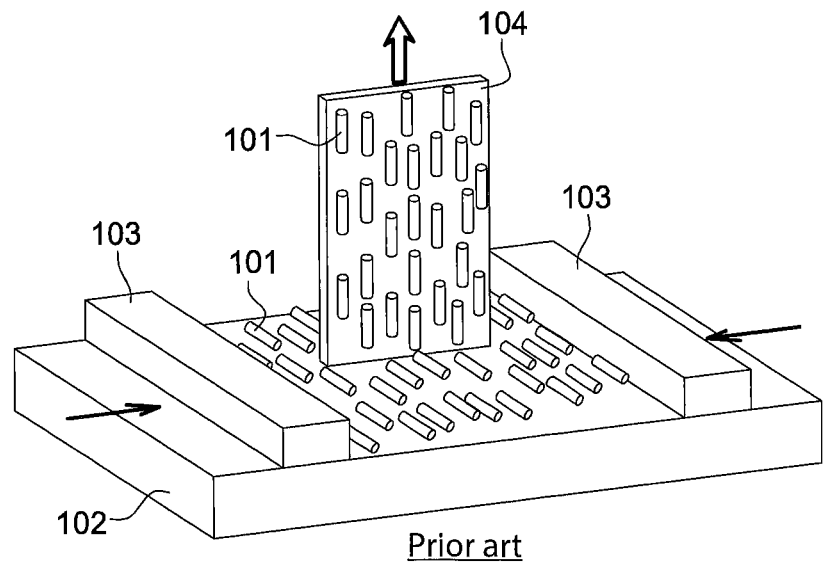
FIGS. 1A and 1B schematically show a method for orienting nanowires, called "Langmuir-Blodgett method" according to prior art.
Figure 1B:
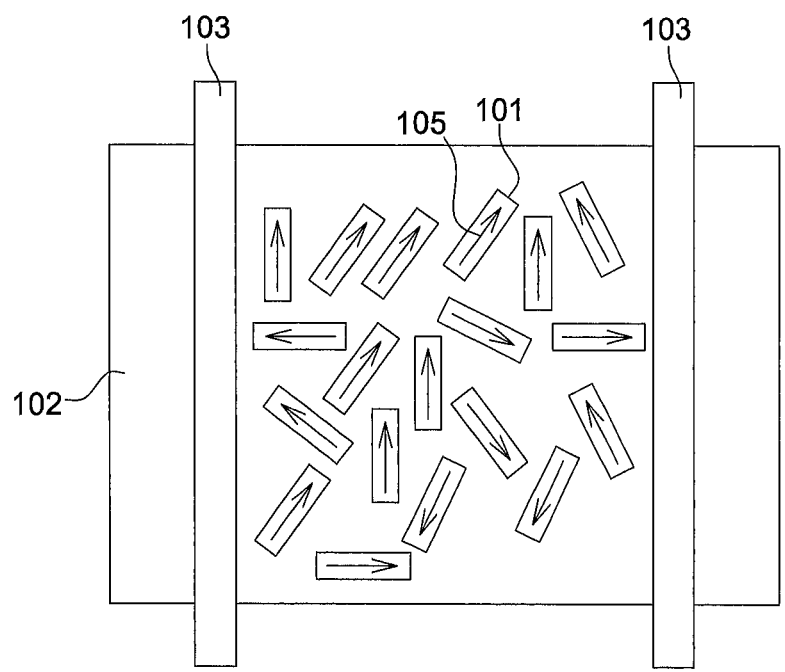

The Figures are presented only for the purposes of information and do not limit the invention in any way.

For increased clarity, identical or similar elements are marked with identical reference signs on all of the figures.

DETAILED DESCRIPTION

A first embodiment of the method for orienting elongated objects arranged on a surface of a substrate according to the invention shall now be described, jointly in reference to FIGS. 2A to 2D and to FIG. 3.

FIG. 2A shows a substrate 201 comprising elongated objects 202 extending according to an initial orientation Z. The initial orientation Z is the favoured orientation of the elongated objects 202. In this embodiment, the initial orientation Z is orthogonal to the surface of the substrate 201. In an alternative embodiment, the elongated objects are initially inclined with respect to the surface of the substrate 201, the initial orientation Z of the elongated objects thus forming an angle between 0 and 90° with the surface of the substrate. The substrate is for example sapphire, silicon, zinc oxide, glass or plastic.

The elongated objects 202 arranged on the surface of the substrate 201 are for example nanowires or nanotubes. The elongated objects 202 are for example made of gallium nitride (GaN) or of zinc oxide (ZnO). Generally, the elongated objects 202 have a form factor greater than or equal to 10. In other words, each elongated object 202 has a length according to the initial orientation Z at least 10 times greater than its other dimensions, for example its diameter, its width or its thickness.

The elongated objects 202 can be obtained by various techniques such as molecular beam epitaxy (MBE), gas phase epitaxy using for example molecules of the metal organic type or hydrides as gas sources, respectively called MOVPE for "Metal Organic Vapour Phase Epitaxy" and HVPE for "Hydride Vapour Phase Epitaxy".

By way of example, nanowires made by molecular beam epitaxy have a length between 10 nm and 5 μm, a diameter between 10 nm and 100 nm, and a surface density able to reach $10^{12}$ cm$^{-2}$. Nanowires made by vapour phase epitaxy have a length between 100 nm and a few millimeters, a diameter between 20 nm and 5 μm, and a surface density that can reach $10^9$ cm$^{-2}$.

The surface density of the elongated objects 202 defines the average separation between the elongated objects 202. This is a parameter that can be important according to the application for which the elongated objects 202 are intended.

Generally, the elongated objects 202 obtained by epitaxy grow using the substrate and the axis of growth may be any with respect to the surface of the substrate 201. For example, document KOESTER, R., M-Plane Core-Shell InGaN/GaN Multiple-Quantum-Wells on GaN Wires for Electroluminescent Devices, Nano Letters October 2011, vol. 11, no. 11, pages 4839, 4845 describes nanowires perpendicular to the substrate, and document TESSAREK, C., Optical properties of vertical, tilted and in-plane GaN nanowires on different crystallographic orientations of sapphire, Journal of Physics D: Applied Physics September 2014, vol. 47, no. 39 describes nanowires that have very different inclinations according to the growth conditions. However, in any case, the elongated objects 202 are parallel to one another.

In addition, the elongated objects 202 can have identical physical properties. For example, the crystallographic polarity, represented by an arrow in FIG. 2A, has the same orientation and the same direction for all of the elongated objects 202. However, generally, this arrow is not necessarily parallel to the initial orientation Z of the elongated object 202, as shown in FIG. 2A'.

Other methods can be used to obtain the elongated objects 202 such as liquid phase chemical growth by using a substrate or top-down approaches based on lithography and etching methods.

Figure 2B:
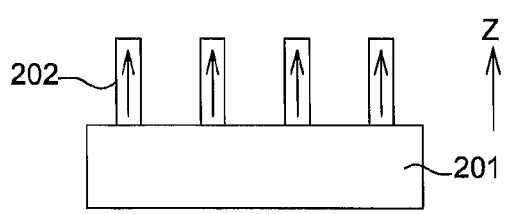
Figure 2B:
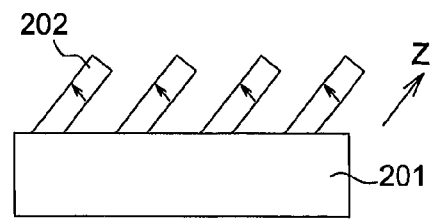
Figure 2B:
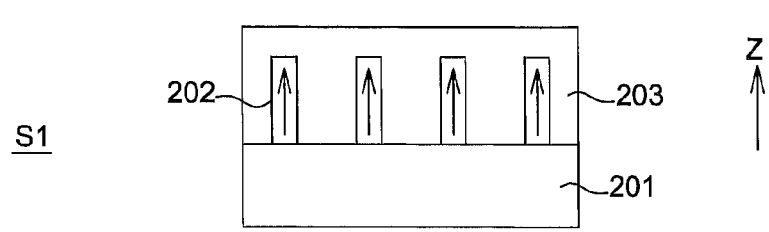

FIG. 2B shows a step S1 of depositing a layer 203 of soft material on the substrate 201. It is by means of this layer 203 of soft material that the elongated objects 202 will be oriented. In an embodiment, the layer 203 of soft material has a thickness at least equal to the length of the elongated objects 202. As such the elongated objects 202 are entirely embedded in the layer 203 of soft material which will facilitate their orientation and will make it possible to prevent causing damage to them.

As shown in FIG. 2B, the layer 203 of soft material is deposited in such a way as to cover all of the elongated objects 202. In an alternative embodiment, the layer 203 of soft material is deposited in such a way as to cover a portion only of the elongated objects 202, with this portion comprising the elongated objects 202 that are to be oriented. It is also possible to deposit the layer 203 of soft material over the entire surface of the substrate and to remove a portion thereof, for example by etching.

The soft material of this layer 203 is for example cyclododecane (CDD) or a polymer, such as polydimethylsiloxane (PDMS), polyethylene glycol (PEG), poly(methyl methacrylate) (PMMA). The soft material may also be a thermoplastic polymer, such as polystyrene or polycarbonate, or thermosetting, such as Bakelite or epoxy resin, or a polymer with shape memory, such as tricyclodecane dimethanol diacrylate (TCMDA), 1,3,5-triallyl-1,3,5-triazine-2,4,6(1H,3H,5H)-trione (TATATO) and 2,2-dimethoxy-2-phenyl acetophenone (DMPA).

A criterion to be taken into account in choosing the soft material is the application for which the elongated objects 202 are intended. For example, a dielectric material will be chosen for controlling the transport of charges and the electrostatic properties. Interest will then be devoted to optimising the dielectric constant of the material but other electrical properties can be considered, for example by using conductive polymers. For an application for optical devices, the soft material will have particular optical properties, in particular concerning the transmission, absorption and reflection thereof. In this case, the optical indices will have to be optimised.

The layer 203 of soft material is deposited according to a technique that depends on the soft material chosen as well as the physical state that it is in, solid, liquid or gas. When the soft material is initially in liquid state, it is for example deposited by a technique called spin-coating. The soft material is deposited at the centre of the substrate 201 then the latter is rotated. The soft material then spreads out over the surface of the substrate 201 under the effect of centrifugal force. This technique is for example used to deposit PDMS.

When the soft material is initially in solid state, such as parylene, a technique of vacuum vapour depositing via evaporation or methods with a plasma base can be used. Finally, for a soft material initially in gas state, such as paracyclophane, there are low-pressure deposit methods.

Figure 2C:
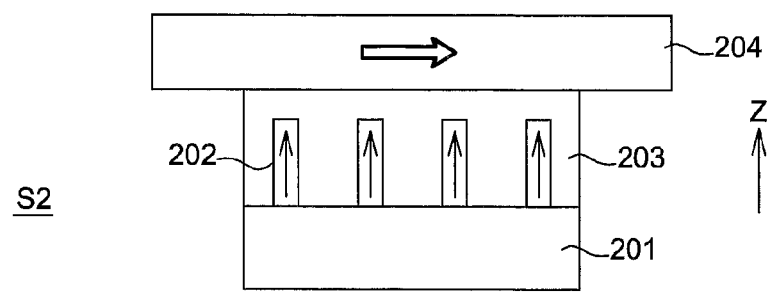

After the depositing of the layer 203 of soft material, a mechanical stress is applied to the latter, during a step S2 shown in FIG. 2C. The mechanical stress makes it possible to modify the orientation of the elongated objects 202. In this first embodiment, the mechanical stress is applied to the entire surface of the layer 203 of soft material and uniformly, for example by means of a plate 204. In other words, the mechanical stress has an identical vector at any point on the surface in order to act in the same way on each elongated object 202 and as such retain the relative orientation between them.

In alternative embodiments, bumpers are used to locally act on the layer 203 of soft material. These bumpers then have shapes and sizes that can be adjusted, with each bumper applying a mechanical stress to the layer 203 of soft material. It is as such possible to modify the orientation of a portion only of the elongated objects 202 or to orient the elongated objects 202 in groups, independently from one another. In this case, the mechanical stresses can be applied simultaneously or sequentially.

In an embodiment, the plate 204, or the bumpers, are arranged in such a way as to exert a pressure on the layer 203 of soft material. Several solutions are then possible in order to apply the mechanical stress to the layer 203 of soft material. A first solution consists in maintaining the substrate 201 fixed and in displacing the plate 204, as shown in FIG. 2C, with the displacement of the plate 204 being symbolised by an arrow having an orientation perpendicular to the initial orientation Z of the elongated objects 202. Inversely, a second solution consists in maintaining the plate 204 fixed and in displacing the substrate 201. Finally, a third solution consists in displacing the substrate 201 and the plate 204 in opposite directions.

The mechanical stress applied can be broken down into elementary stresses of the shear and torsional types. In this first embodiment, the mechanical stress applied on the layer 203 of soft material is a shear stress. With a shear stress, the elongated objects 202 are inclined by an angle between −90° and 90° with respect to the normal to the surface of the substrate. In the embodiment of FIGS. 2A to 2D, the plate 204 performs a displacement that is sufficient to lay out the elongated objects 202. The latter can break at their base, i.e. on the interface that they form with the substrate 201. Indeed, at this interface, the elongated objects 202 can have defects, dislocations or a concentration of stresses. However, in the case for example of very thin elongated objects 202, the latter can curve without breaking on their base if the deformation of the elongated objects 202 remains in the elastic domain.

Figure 3:
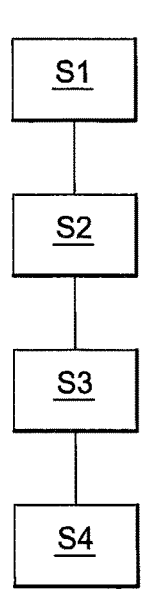
FIG. 3 shows a functional diagram of the embodiment of FIGS. 2A to 2D.

The method according to an embodiment the invention beneficially comprises a step S3, shown in FIG. 3, of modifying the viscosity of the soft material of the layer 203. This step consists in modifying the mechanical properties of the layer 203 of soft material. It is for example possible to harden the layer 203 of soft material in order to freeze the orientation of the elongated objects 202. It is also possible to soften the layer 203 of soft material in order to continue working thereon.

There are various methods for modifying the viscosity of the soft material. The method used depends on the choice of the soft material. The layer 203 of soft material is for example subjected to a variation in temperature such as an annealing if it is desired to harden it. By way of example, the annealing of a layer of PDMS is carried out at a temperature of 80° C. for 50 mn. Indeed, the degree of cross-linking of this polymer is modified under the effect of the variation of temperature.

It is also possible to adjust the temperatures for glass transition, melting and fluidification of the soft material. As such, it is possible to pass the soft material from a vitreous state to a rubbery or viscous state. The elastic coefficients vary greatly with these changes in state, which makes it possible in practice to explore wide ranges of displacements for the same force applied.

The modification of the viscosity of the layer 203 of soft material may also be carried out by chemical reaction. In this case, the layer 203 of soft material is for example placed in contact with a gas or a solution in order to modify the nature of the chemical bonds that form it. As such, the physical properties of the layer 203 of soft material are also modified.

Another method consists in exposing the layer 203 of soft material to radiation, for example photons or ions, that cause a modification in the degree of cross-linking or drying, of the layer 203 of soft material.

Figure 2D:
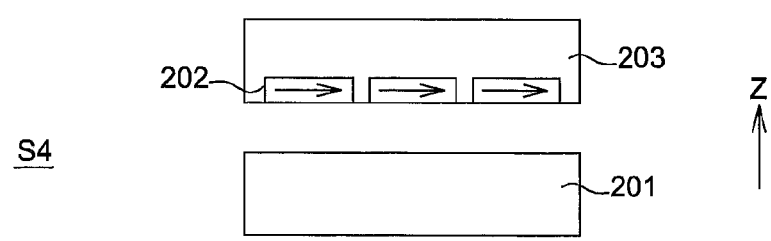

Beneficially, the method according to an embodiment the invention comprises a step S4 of peeling, shown in FIG. 2D, during which the layer 203 of soft material with the elongated objects 202 is separated from the substrate. As such, the layer 203 of soft material with the elongated objects 202 can be integrated into a device or undergo new operations. In an embodiment, the step S4 of peeling is carried out after having sufficiently hardened the layer 203 of soft material, as shown in FIG. 3. As such, this makes it possible to prevent disorienting the elongated objects 202 by applying to the layer 203 of soft material mechanical stresses generated during the step S4 of peeling. Once peeled, the layer 203 of soft material with the elongated objects 202 can for example be arranged between two metal electrodes in order to form a capacitive piezoelectric sensor.

Thanks to the method according to an embodiment of the invention, the problems present with the Langmuir-Blodgett method are overcome. First of all, disorienting elongated objects 202 is avoided. Indeed, it is possible to orient the elongated objects 202 in the same orientation and in the same direction which makes it possible to obtain an addition of the individual physical properties of each elongated object 202.

In addition, the elongated objects 202 do not form bundles which would hinder the operation of the sensor, for example by creating short-circuits between the electrodes. Moreover, the steps of the method are less numerous and easier to implement which reduces the time and the cost required for orienting elongated objects.

Finally, it is possible to work on large surfaces, which can for example reach several square meters. Indeed, today substrates made of sapphire or of silicon are plates with a diameter of 450 mm, substrates made of glass have dimensions that may be less than the meter and the flexible substrates can be used in the form of unwound strips of several square meters. The dimensions of the substrates are only limited by the machines for manufacturing elongated objects 202.

A second embodiment of the method for orienting elongated objects shall now be described in reference to FIG. 4. As in the first embodiment of the method, a substrate 201 is provided comprising elongated objects 202 extending according to an initial orientation Z for example orthogonal to the surface of the substrate 201. The elongated objects 202 are covered by a layer 203 of soft material and a plate 204 is arranged on the layer in such a way as to exert a pressure thereon.

In this second implementation, the elongated objects 202 are wires intended for the manufacture of a light-emitting diode. The wires are for example made of gallium nitride (GaN) and have a core-shell structure with quantum wells made of indium gallium nitride (InGaN). Each wire has an intrinsic emission cone that has the same orientation as the initial orientation Z. The mechanical stress applied is here a torsional stress. The substrate 201 is maintained fixed and the plate 205 is rotated about an axis A parallel to the initial orientation Z of the elongated objects 202.

Figure 4:
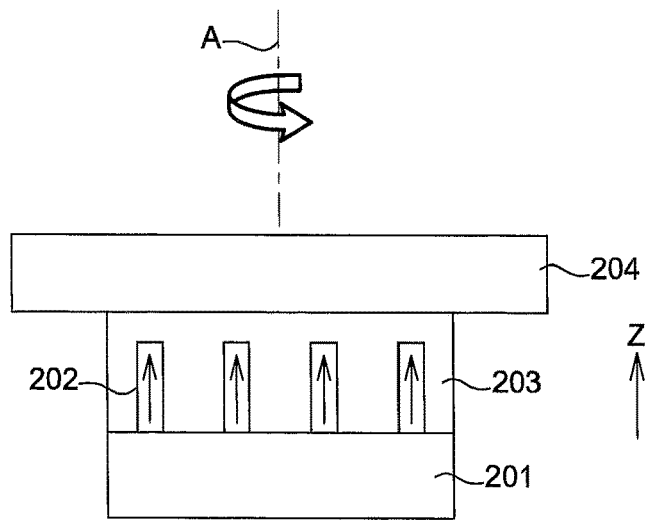
FIG. 4 schematically shows a second embodiment of the method for orienting elongated objects according to the invention.
Figure 5:
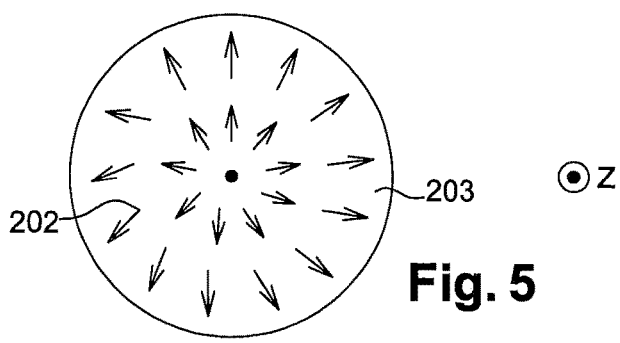
FIG. 5 is a top view of the oriented elongated objects of FIG. 4.

FIG. 5 shows as a top view the inclination of the oriented elongated objects 202 of FIG. 4. In the case of a torsion, the lateral displacement is zero on the axis of rotation A and is maximum at the periphery of the layer 203 of soft material. The elongated objects 202 are then inclined by an angle that depends on the distance that separates the elongated objects 202 from the axis of rotation A. In other words, the farther apart the elongated objects 202 are from the axis of rotation A, the more inclined they are. As such, the emission field of all of the elongated objects 202 is structured by the disorientation of each one of the emission cones.

In prior art, in order to form light-emitting diodes, the elongated objects 202 are encapsulated in dispersive optical elements, having for example the shape of domes, in order to increase the emission diagram of the diodes. Thanks to the invention, it is possible to remove the step of encapsulating or at least simplify it by placing for example just one layer of protection. Due to this, the diodes will also be flatter.

In the two embodiments of the method described hereinabove, the layer 203 of soft material is retained. In alternative embodiments, after having applied the mechanical stress to the layer 203 of soft material, the latter is removed, partially or entirely. In this case, the layer of soft material is referred to as "sacrificial". It is for example possible to carry out a partial attack of the layer 203 of soft material in order to release the top of the elongated objects 202 so as to create electrical contacts.

The layer of soft material is removed for example during a step of evaporation. In this case, the soft material chosen has, for example, a low sublimation temperature. This is the case for example with cyclododecane (CDD) which at an ambient temperature has the form of a solid and which has a sublimation temperature of about 60° C. The layer of soft material may also be removed by chemical or physical means, such as a dissolution or etching.

In an alternative embodiment, the method comprises a step of depositing, on the layer 203 of soft material, at least one additional layer having a rigidity that is different from that of the layer of soft material. A stack comprising the substrate 201, the layer 203 of soft material and the additional layer is then obtained. The additional layer is for example deposited by means of a technique used for the deposition of the layer 203 of soft material. Possibly, the mechanical stress is applied on the additional layer then transmitted to the layer 203 of soft material via the interface between the additional layer and the layer 203 of soft material.

The adding of the additional layer can have several objectives that will condition the choice of a material from which the additional layer is made. A first objective of the additional layer is to adjust the distribution of the mechanical stress applied on the layer 203 of soft material through the interface between the additional layer and the layer 203 of soft material. In this case, the viscosity and the elastic modules of the material of the additional layer as well as the sliding relative to the interface have to be adapted and quantified. Moreover, this makes it possible to control the final displacement of the elongated objects 202, in particular if the rigidity of the additional layer is lower than that of the layer 203 of soft material. Indeed, a millimetric displacement applied to the additional layer can imply a micrometric displacement on elongated objects 202.

A second objective of the additional layer is to increase the rigidity of the stack thus making it possible to facilitate the peeling or the transfer of the layer 203 of soft material. This is a handle function. In this case, the rigidity of the additional layer is greater than that of the layer 203 of soft material.

A third objective of the additional layer is to add a feature to the final device to which the elongated objects are intended. The additional layer can for example provide an electrical conduction or make it possible to adapt an optical indice.

Figure 6:
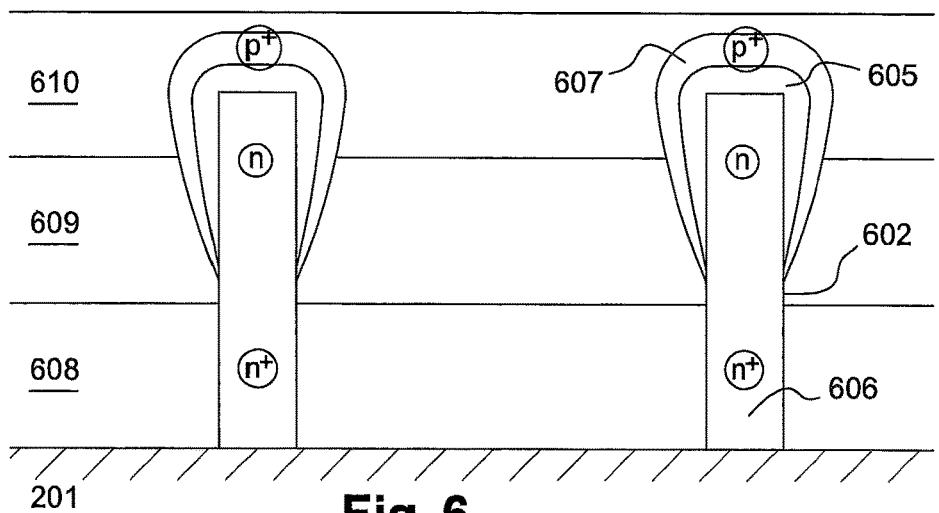
FIG. 6 schematically shows an alternative embodiment of the method for orienting elongated objects according to the invention, with several layers of soft material and an additional layer being deposited.

In another embodiment, it is possible to stack several different layers of soft materials and several different additional layers. The layers of soft materials and the additional layers can be alternating. FIG. 6 shows the case of a substrate 201 on which are arranged wires 602 made of gallium nitride, the wires 602 comprising quantum multi-wells 605 made of indium gallium nitride. Each wire 602 has an n-doped base 606 and a p-doped upper portion 607.

A first layer 608 of a first soft conductive material is deposited on the substrate in order to inject current in the base 606 of the wires 602. Then, an additional insulating layer 609 is deposited on the first layer 608. A second layer 610 of a second conductive soft material is deposited on the additional insulating layer 609 in order to take the electrical contact on the upper portion 607 of the wires 602. The first soft material and the second soft material may be identical or different. The method according to the invention is applied to all of the layers 608, 609, 610.

It will be appreciated that the invention is not limited to the embodiments described in reference to the figures and alternative embodiments could be considered without leaving the scope of the invention.

The invention claimed is:

1. A method for orienting elongated objects arranged on a surface of a substrate, the elongated objects extending according to an initial orientation, the method comprising:

depositing on the surface of the substrate at least one layer of a soft material covering at least partially a portion of the elongated objects, and applying a mechanical stress on at least one portion of the layer of soft material in such a way as to cause a displacement of said at least one portion of the layer of soft material and modify the orientation of at least one portion of the elongated objects, the displacement of said at least one portion of the layer of soft material caused by the mechanical stress resulting in a displacement of said at least one portion of the elongated objects.

2. The method according to claim 1, wherein the elongated objects have a length according to their initial orientation, the layer of soft material having a thickness at least equal to the length of the elongated objects.

3. The method according to claim 1, wherein the mechanical stress applied on said at least one portion of the layer of soft material is a shear stress and/or a torsional stress.

4. The method according to claim 1, wherein the mechanical stress is applied by means of a bumper exerting a pressure on said at least one portion of the layer of soft material.

5. The method according to claim 1, further comprising modifying a viscosity of the layer of soft material.

6. The method according to claim 5, wherein the modification of the viscosity of the layer of soft material is carried out by an annealing, a chemical reaction or exposure to radiation.

7. The method according to claim 1, further comprising peeling during which the layer of soft material, with the elongated objects, is separated from the substrate.

8. The method according to claim 1, further comprising partially or entirely removing the layer of soft material.

9. The method according to claim 8, wherein the removing is carried out by evaporation, by chemical dissolution or by etching.

10. The method according to claim 1, further comprising depositing at least one additional layer on the layer of soft material, before or after the application of the mechanical stress.

11. The method according to claim 10, wherein the mechanical stress is applied on the additional layer.

12. The method according to claim 10, further comprising partially or entirely removing the additional layer.

13. The method according to claim 1, wherein the soft material is cyclododecane or a polymer chosen from among the following: polydimethylsiloxane, polyethylene glycol, poly(methyl methacrylate).

14. The method according to claim 1, wherein the soft material is a material that has an electrical or optical property.

* * * * *